United States Patent [19]

Viswanathan et al.

[11] Patent Number: 5,608,401
[45] Date of Patent: Mar. 4, 1997

[54] THREE-LEVEL DIGITAL-TO-ANALOG CONVERTER FOR LOW-POWER CONSUMPTION

[75] Inventors: Thayamkulangara R. Viswanathan, Albany Township; Louis A. Williams, III, Allentown, both of Pa.

[73] Assignee: Lucent Technologies Inc., Murray Hill, N.J.

[21] Appl. No.: 365,527

[22] Filed: Dec. 28, 1994

[51] Int. Cl.[6] .................................................. H03M 1/66
[52] U.S. Cl. ............................................ 341/144; 341/143
[58] Field of Search ..................................... 341/143, 144, 341/57

[56] References Cited

U.S. PATENT DOCUMENTS

| | | | |
|---|---|---|---|
| 5,134,402 | 7/1992 | Miyoshi | 341/144 |
| 5,160,896 | 11/1992 | McCorkle | 330/251 |
| 5,206,648 | 4/1993 | Yukawa | 341/143 |
| 5,257,026 | 10/1993 | Thompson et al. | 341/118 |
| 5,274,375 | 12/1993 | Thompson | 341/143 |
| 5,406,283 | 4/1995 | Leung | 341/143 |

FOREIGN PATENT DOCUMENTS

| | | |
|---|---|---|
| A-0480509A1 | 4/1992 | European Pat. Off. . |
| A-0525777A1 | 2/1993 | European Pat. Off. . |
| A-0543224A2 | 5/1993 | European Pat. Off. . |

OTHER PUBLICATIONS

IEEE International Solid State Circuits Conference, vol. 34, 1 Feb. 1991, pp. 74–75, 293, Toshiyuki Okamoto, "A 16b Oversampling CODEC with Filtering DSP".

European Search Report, Nov. 4, 1996.

*Primary Examiner*—Marc S. Hoff

[57] ABSTRACT

A three-level digital-to-analog (D/A) converter receives digital signals, derives three-level control signals and generates analog signals. The three-level D/A converter comprises a control device for converting incoming digital signals to control signals having three levels, switches for switching responsive to these three levels to control a network of switches, and a load responsive to these switches to generate corresponding analog signals. The control device comprises a feedback control loop and a quantizer to produce the control signals having High, Medium and Low levels. The switches are preferably four switches that open and close cooperatively in response to the High, Medium and Low levels. The load generates a positive, zero or negative voltage reference in the analog signals in response to the operation of the four switches.

22 Claims, 2 Drawing Sheets

FIG. 1
(PRIOR ART)
FIG. 2
(PRIOR ART)
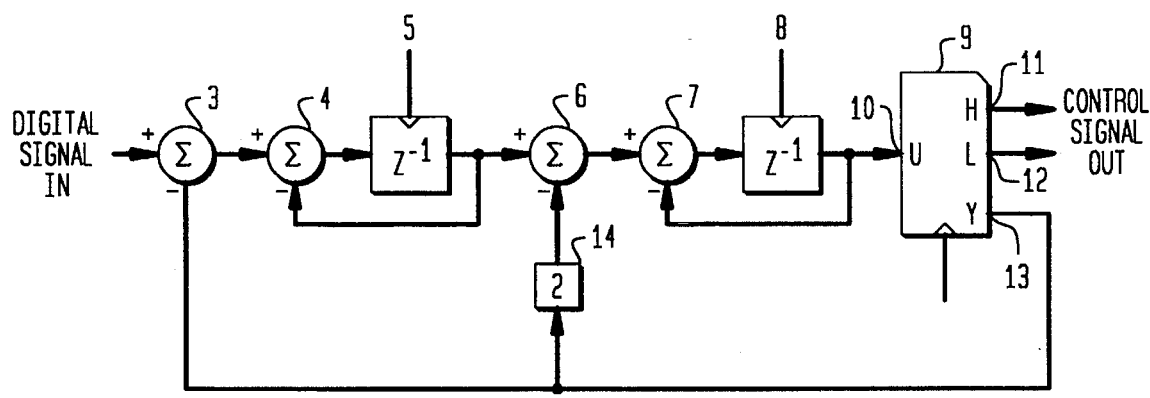
FIG. 3
(PRIOR ART)
| LEVEL | U | H | L | Y |
|---|---|---|---|---|
| HIGH | $\frac{\Delta}{2} \leq U$ | 1 | 0 | $\Delta$ |
| MEDIUM | $-\frac{\Delta}{2} < U < \frac{\Delta}{2}$ | 0 | 0 | 0 |
| LOW | $U \leq -\frac{\Delta}{2}$ | 0 | 1 | $-\Delta$ |

THREE-LEVEL DIGITAL-TO-ANALOG CONVERTER FOR LOW-POWER CONSUMPTION

BACKGROUND OF THE INVENTION

1. Technical Field

This invention relates generally to digital-to-analog (D/A) converters and more particularly to a three-level D/A converter for low consumption of power.

2. Description of the Prior Art

Recently, considerable interest has developed in a digital-to-analog (D/A) converter that consumes low power for portable voice or audio band products. Generally, a D/A converter converts a digital signal to an analog signal by assigning a voltage weight to each bit in the digital word and summing up the voltage weights of the entire word. To directly implement this conversion process, the D/A converter requires a network of relatively precise components, usually resistors or capacitors.

To avoid the requirement of precise components, the current practice in the design of a D/A converter commonly incorporates a two-level sigma-delta modulator, pulse-width modulator or other similar control devices. The sigma-delta modulator employs the technique of oversampling and one-bit quantization. The sigma-delta modulator generally has a quantizer and a feedback loop. The sigma-delta modulator in a D/A converter receives a digital signal and the quantizer generates output for both the feedback loop and switching circuitry of a load. The feedback control, by taking the difference between this output and input provides an error signal. By repeating this process, the feedback control forces this error toward zero. The output switching circuitry generates an analog signal. The sigma-delta modulator requires fewer number of precision circuits than a conventional D/A converter, and is used for a simpler and more efficient D/A converter design.

The pulse-width modulator converts a digital input code to generate a train of pulse of fixed frequency, with width proportional to the input count. The pulse-width modulator typically comprises a counter, comparator and high-frequency clock. In a D/A converter the pulse-width modulator generates an analog output voltage proportional to the digital input code. This type of D/A conversion is more commonly used when the load is slowly responding system such as a switching regulator, mechanical taped speed servo or electromagnetic controller.

Two-level control devices as mentioned above alternate between the two outputs, High and Low levels, regardless of how small the digital input is. For instance, if the accumulated error is even slightly positive, the control signals for the High level will result. If the accumulated error is even slightly negative, then the control signals for the Low level will result.

One example of a two-level D/A converter is disclosed in U.S. Pat. No. 5,160,896 to McCorkle. The switching circuitry disclosed therein is a class D amplifier including a pair of output MOSFET switches. In a class D amplifier, an active device is used as an on-off switch and output variation is controlled by a modulator or supply voltage source. The output of a class D amplifier circuit, therefore, is derived by switches and there is no gradual translation between different levels. The output voltage alternates between positive and negative levels. As a result, the two-level D/A converter constantly charges its load by either positive or negative voltages and requires an uninterrupted power supply. Such requirements cause constant power consumption and thus inefficient use of power. This can be a serious burden especially for portable voice or audioband products, the appeal of which often depends on a cost effective and compact power supply or a long-lasting battery.

Three-level D/A converters have also been proposed. For instance, U.S. Pat. No. 5,206,648 to Yukuwa discloses a three-level D/A converter which comprises switches and capacitors between these switches. In such a configuration, the load always draws power from the voltage source regardless of the level of the control signals. Similarly, a three-level D/A converter disclosed in U.S. Pat. No. 5,274,375 to Thompson also includes switching capacitors which constantly draw current from the source. Moreover, the Thompson switching capacitor requires two separate voltage sources providing the same voltages with opposite polarities. This is a difficult requirement to meet and often causes distortion in output unless a significant effort is given for calibration of a voltage supply.

The apparatus according to the present invention provides an improved D/A converter which avoids the above noted disadvantages.

SUMMARY OF THE INVENTION.

The digital-to-analog (D/A) converter according to the present invention is a three-level converter with a class D amplifier. The converter comprises a control device, a switching mechanism, and a load. The control device converts incoming digital signals to control signals having three levels. The switching mechanism coupled with the control device operate in response to the control signals. The load coupled with the switches generates analog signals in response to the switches.

The control device comprises a control loop and a quantizer for generating control signals having three levels, High, Medium and Low. The class D amplifier preferably includes four switches which are connected to a power source. The four switches are also connected to the control device to switch in a prearranged configuration in response to the control signals. For example, the first and second switches may close in response to the High level; all four switches may open in response to the Medium level; and the third and fourth switches may close in response to the Low level. The load generates an analog signal in positive, zero or negative voltage references in response to the above switch closures.

The three-level converter according to the present invention provides D/A conversion with significant power savings over a two level converter by using a third level in which no power is drawn from the source. The three-levels may be generated by various devices including a sigma-delta modulator and a pulse-width modulator. The third level (called the Medium level in the present invention) causes the switches connecting the source and the load to open. Thus, there is no power drain during the third level. Advantageously, the converter is configured to operate at the third level most frequently to further reduce power consumption.

BRIEF DESCRIPTION OF THE DRAWINGS

In the drawings:

FIG. 1 illustrates a block diagram of a prior art three level D/A converter of the present invention.

FIG. 2 illustrates a block diagram of a prior art three-level sigma-delta modulator.

FIG. 3 is a prior art truth table representation of a quantizer used in the sigma-delta modulator.

DETAILED DESCRIPTION OF THE PREFERRED EMBODIMENT

Figure 4:
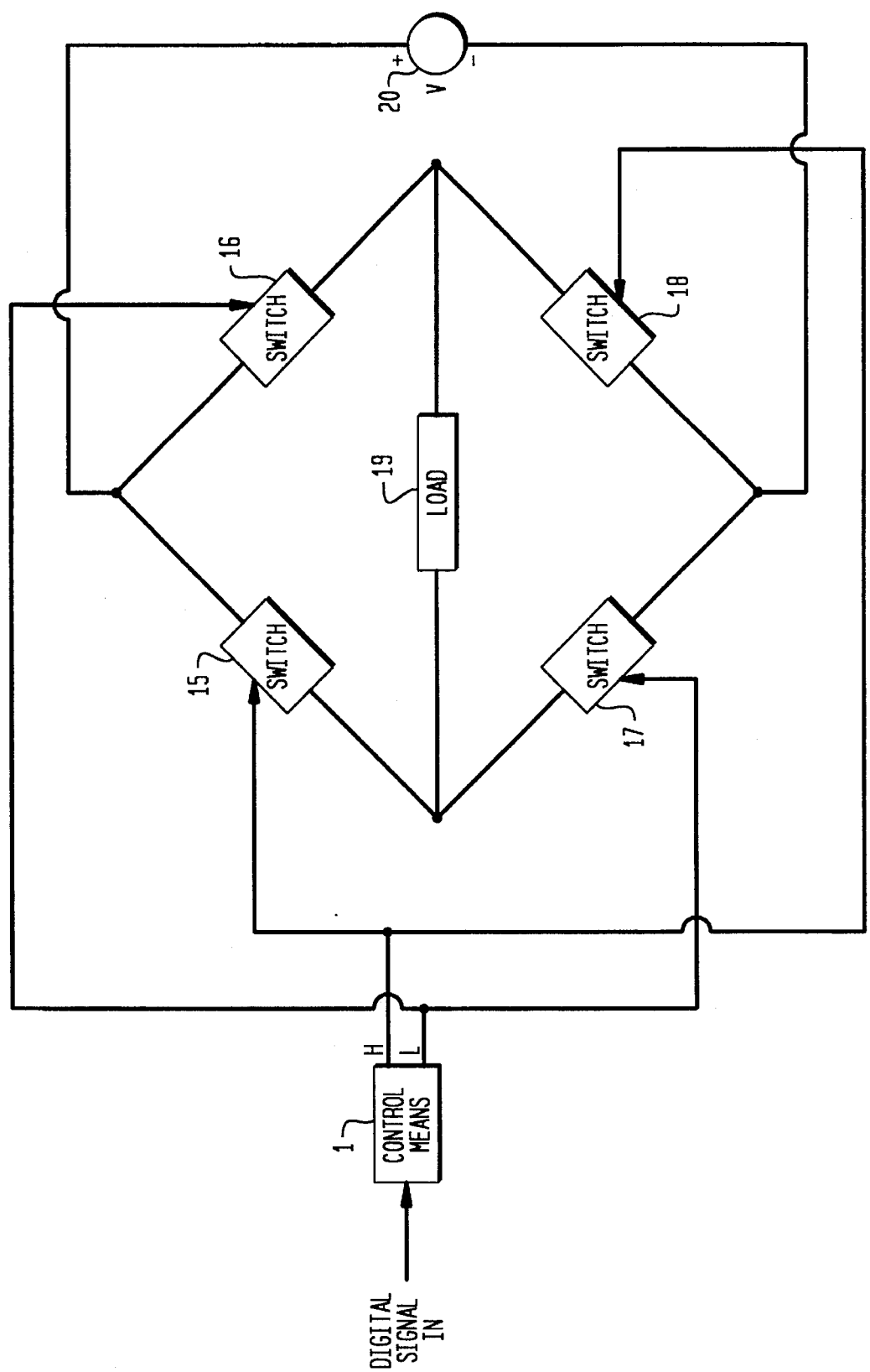
FIG. 4 illustrates a schematic diagram of a class D amplifier switching configuration for the three level D/A converter according to the present invention.

Referring to FIG. 1, a brief overview of a prior art three-level D/A conversion process is illustrated. A control means 1 is designed to receive multibit digital signals. The control means 1 converts these multi-bit digital signals to control signals that can indicate three levels, herein denoted High, Medium and Low. A switch means 2 is coupled with the control means 1 to receive those control signals. The switch means 2 then generates positive, zero or negative voltage references in the analog signals in response to the High, Medium or Low levels. The continuous and repeated process of generating these voltage references produces analog signals.

FIG. 2 illustrates a prior art three-level sigma-delta modulator. Unlike a two level sigma-delta modulator used in a D/A converter, the three-level sigma-delta modulator produces control signals for an additional level (called a Medium level in the present invention), if the accumulated error is near zero.

As shown, a digital signal enters the sigma-delta modulator through a summing junction 3. The difference between the digital signal input and a feedback signal from the feedback output section 13 is taken in order to minimize error. The output of the summing junction 3 is fed to a summing junction 4. This input is summed with the output from the first delay element 5. The output of the summing junction 4 is fed to the first delay element 5, in order to accumulate the total error and, through the feedback, to cause the average output value to track the input values gradually. Thus, the time-average of the analog output is approximately equal to the time-average of the digital input. The output of the first delay element 5 is fed to a summing junction 6. The input to summing junction 6 is summed with the feedback signal from the feedback output section 13 multiplied by 2 in a multiplier 14. The output of the summing junction 6 is fed to a summing junction 7. This input is summed with the output from a delay elememt 8. The output of summing junction 7 is fed to the delay element 8. The output of the delay element 8 enters a digital signal input section 10 of a quantizer 9. The quantizer 9 assigns this input to one of three signal regions and codes these three levels, High, Medium and Low into two binary control signals "H" and "L" at control signal outputs 11 and 12 respectively. One-clock cycle delay elements 5 and 8, and the summing junctions 3, 4, 6 and 7 form the forward path of the three-level sigma-delta modulator. Therefore, the sigma-delta modulator converts a sequence of multi-bit digital signals so that a sequence of three-level control signals can represent the input digital signals.

FIG. 3 illustrates a table that defines the three-level outputs of the quantizer in relationship to the input. The symbols, "U", "H", "L"and "Y", denote the incoming or outgoing signals at 10, 11, 12 and 13, respectively. The quantity $\Delta$ is defined as the maximum range of the input digital signal at the digital signal input section 10, that is, $-\Delta \leq X \leq \Delta$, where x denotes the multi-bit digital input. The quantizer receives a multi-bit signal U and codes that input into one of three regions at the signal input section 10. As shown, there is assigned the Medium level for the signal U with a value greater than $-\Delta/2$ and less than $\Delta/2$. Accordingly, the quantizer now can detect the signal with value near zero to produce the Medium level. Such incoming signal U would have produced only the High or Low level in the two-level quantizer. The quantizer generates two one-bit control signals H and L that can be set to a logic of high or low and a multi-bit signal Y. The control signal H is set to a logic high for the High level when the value of the input signal U falls in the range $\Delta/2 \leq U$. The output Y in this case is set to $\Delta$. The control signal L is set to a logic high for the Low level when the value of the input signal U falls in the range $U \leq -\Delta/2$. The output Y in this case is set to $-\Delta$. Both control signals H and L are set to a logic low when the value of the input signal U falls within the range $-\Delta/2 < U < -\Delta/2$. The multi-bit signal Y with values $-\Delta$, 0 or A is then fed back to summing junctions 3 and 6 to be summed with the input to minimize error.

The control signal outputs as shown in FIG. 2 are now fed to the class D amplifier switch circuit in FIG. 4. This switch circuit of the three-level D/A converter comprises a DC voltage source 20 and four switches 15, 16, 17 and 18 are connected to a load 19. The switches are generically controlled switching devices such as transistors or relays. The load 19 is preferably a two terminal floating load capable of receiving bidirectional current flow, such as a speaker or a transformer.

When the control signals are at the High level, the switches 15 and 18 are closed and the switches 16 and 17 are open to produce a positive voltage reference across the load 19. When the control signals are at the Low level, the switches 16 and 17 are closed and the switches 15 and 18 are open to produce a negative voltage across the load 19. When the control signals are at the Medium level, the switches 15, 16, 17 and 18 are all open to produce a zero voltage reference across the load 19. A significant advantage of this switch configuration is that there is no requirement for calibration of voltage sources, as in the switched-capacitor D/A converter in Thompson. Moreover, the simplicity of the circuit contributes to the manufacturing cost effectiveness.

Assuming the load has a resistance of R and the voltage across the load 19 of V, the power applied to the load will be $V^2/R$ when the control signals indicate the High or Low level. When the control signals indicate the Medium level, no power is applied to the load. This results in a typical power savings of a factor of two or better over a conventional two-level design having only High and Low levels. Further, in applications such as conversion of digital voice signals, the Medium level is most frequently activated, such as in pauses in a conversation, resulting in further power reduction.

While the invention has been described particularly with reference to the three-level sigma-delta modulator, the D/A converter in this invention, however, can employ any device that can generate control signals having three-levels to improve cost efficiency. What has been described here is merely illustrative of other arrangements and methods that may be implemented by those skilled in the art. Accordingly, it is intended by the appended claims to cover all modifications of the invention which fall within the true spirit and scope of the invention.

We claim:

1. A three-level digital-to-analog converter comprising:
   three level control means for converting incoming digital signals to control signals having Low, Medium and High levels;

a plurality of switches coupled with and responsive to said three level control means;

load means positioned between and responsive to said plurality of switches for generating analog signals; and a source of potential coupled to said switches wherein substantially no power is drawn from said source when said control signals are at said Medium level.

2. The converter as in claim 1, wherein said control means comprises a threelevel sigma-delta modulator.

3. The converter as in claim 1, wherein said control means comprises:

means for receiving said digital signals;

feedback control means for minimizing errors in said control means; and means for quantizing said digital signals to said control signals having three levels of High, Medium and Low.

4. The converter as in claim 3, wherein said means for quantizing comprises:

a digital signal input section for receiving said digital signals;

a digital signal output section for generating digital signals for said feedback control means;

a control signal output section for generating control signals for said High, Medium and Low levels.

5. A three level digital-to-analog converter comprising:

three level control means for converting incoming digital signals to control signals having Low, Medium and High levels;

first, second, third and fourth switches each coupled to and responsive to said three level control means, said first and second switches each closing in response to said control signals for said High level, said third and fourth switches each closing in response to said control signals for said Low level, and said first, second, third and fourth switches each opening in response of control signals for said Medium level;

means for providing a source of voltage potential across said switches; and load means positioned between and responsive to said switches for generating analog signals.

6. The converter as in claim 5, wherein said load means comprises:

means for generating a positive voltage reference across said load means when said first and second switches are closed to activate said load means;

means for generating a negative voltage reference across said load means when said third and fourth switches are closed to activate the load means;

means for generating a zero voltage reference across said load means when said first, second, third and fourth switches are open to deactivate said load means.

7. The converter as in claim 6, wherein said load means comprises a speaker.

8. The converter as in claim 6, wherein said load means comprises a transformer.

9. A method of converting digital signals to analog signals comprising:

converting incoming digital signals to control signals having High, Medium and Low levels;

setting a plurality of switches in response to said control signals; and generating analog signals from a load positioned between said plurality of switches in response to said switches and derived from a source of potential coupled to said switches, wherein substantially no power is drawn from said source of potential when said control signals are at said Medium level.

10. The method as in claim 9, wherein converting step comprises:

receiving said incoming digital signals;

converting said incoming digital signals to control said converting step; and quantizing said digital signals to said quantized control signals.

11. The method as in claim 10, wherein quantizing step comprises:

receiving said digital signals;

generating feedback digital signals for said controlling step;

generating quantized control signals for said High, Medium and Low levels.

12. A method of converting digital signals to analog signals comprising:

converting incoming digital signals to control signals having High, Medium and Low levels;

setting a plurality of switches in response to said control signals by closing at least a first one of said switches in response to said High level, closing at least a second one of said switches in response to said Low level, and opening at least said first and second ones of said switches in response to said Medium level; and generating analog signals from a load positioned between said plurality of switches in response to said switches.

13. The method as in claim 12 wherein setting step comprises:

closing a first switch and a second switch simultaneously in response to said control signals for said High level;

closing a third switch and a fourth switch simultaneously in response to said control signals for said Low level; and opening said first, second, third and fourth switches simultaneously in response to control signals for said Medium level.

14. The method as in claim 13 wherein generating step comprises:

generating a positive voltage reference across said load means when said first and second switches are closed to activate the said load;

generating a negative voltage reference across said load means when said third and fourth switches are closed to activate the said load; and generating a zero voltage reference across said load means when all switches are open to deactivate said load.

15. A three-level digital-to-analog converter comprising:

three level control means for converting incoming digital signals to control signals having Low, Medium and High levels;

a class D amplifier comprising a plurality of switches coupled with and responsive to said three level control means;

load means responsive to said plurality of switches for generating analog signals; and a source of potential coupled to said switches wherein substanitally no power is drawn from said source when said control signals are at least Medium level.

16. The converter as in claim 15, wherein said control means comprises a three-level sigma-delta modulator.

17. The converter as in claim 15, wherein said control means comprises:
   means for receiving said digital signals;
   feedback control means for minimizing errors in said control means; and
   means for quantizing said digital signals to said control signals having three levels of High, Medium and Low.

18. The converter as in claim 17, wherein said means for quantizing comprises:
   a digital signal input section for receiving said digital signals;
   a digital signal output section for generating digital signals for said feedback control means;
   a control signal output section for generating control signals for said High, Medium and Low levels.

19. A three-level digital-to-analog converter comprising:
   three level control means for converting incoming digital signals to control signals having Low, Medium and High levels;
   a class D amplifier comprising first, second, third and fourth switches each coupled to and responsive to said three level control means, said first and second switches each closing in response to said control signals for said High level, said third and fourth switches each closing in response to said control signals for said Low level, and said first, second, third and fourth switches each opening in response to control signals for said Medium level;
   means for providing a source of voltage potential across said switches; and
   load means responsive to said plurality of switches for generating analog signals.

20. The converter as in claim 19, wherein said class D amplifier load means comprises:
   means for generating a positive voltage reference across said load means when said first and second switches are closed to activate said load means;
   means for generating a negative voltage reference across said load means when said third and fourth switches are closed to activate the load means;
   means for generating a zero voltage reference across said load means when said first, second, third and fourth switches are open to deactivate said load means.

21. The converter as in claim 20, wherein said load means comprises a speaker.

22. The converter as in claim 20, wherein said load means comprises a transformer.

* * * * *